United States Patent
Ahmad et al.

(10) Patent No.: US 6,894,298 B2
(45) Date of Patent: May 17, 2005

(54) ARRANGEMENT FOR GENERATING EXTREME ULTRAVIOLET (EUV) RADIATION BASED ON A GAS DISCHARGE

(75) Inventors: Imtiaz Ahmad, Goettingen (DE); Guido Schriever, Goettingen (DE); Juergen Kleinschmidt, Weissenfels (DE)

(73) Assignee: Xtreme technologies GmbH, Jena (DE)

( * ) Notice: Subject to any disclaimer, the term of this patent is extended or adjusted under 35 U.S.C. 154(b) by 346 days.

(21) Appl. No.: 10/267,373

(22) Filed: Oct. 9, 2002

(65) Prior Publication Data

US 2003/0068012 A1 Apr. 10, 2003

(51) Int. Cl.[7] .............................................. B23K 10/00
(52) U.S. Cl. ............................. 250/504 R; 250/505.1; 378/119; 378/121; 378/122; 378/145; 315/111.31; 315/111.41; 313/231.31; 313/231.41; 219/121.31; 219/121.41
(58) Field of Search ............................ 378/34, 84, 119, 378/145, 121, 122; 250/493.1, 505.1, 504 R; 315/111.31, 111.41, 111.81, 111.91; 219/121.31, 121.41, 121.48; 313/231.31, 231.41

(56) References Cited

U.S. PATENT DOCUMENTS

| | | | |
|---|---|---|---|
| 4,635,282 A | 1/1987 | Okada et al. | |
| 5,499,282 A | 3/1996 | Silfvast | |
| 5,504,795 A | 4/1996 | McGeoch | |
| 5,763,930 A | 6/1998 | Partlo | |
| 6,051,841 A | 4/2000 | Partlo | |
| 6,226,307 B1 | 5/2001 | Desor et al. | |
| 6,408,052 B1 * | 6/2002 | McGeoch | 378/119 |
| 6,414,438 B1 * | 7/2002 | Borisov et al. | 315/111.31 |
| 6,421,421 B1 * | 7/2002 | McGeoch | 378/119 |
| 6,452,194 B2 * | 9/2002 | Bijkerk et al. | 250/492.2 |
| 6,466,599 B1 * | 10/2002 | Bragin et al. | 372/58 |
| 6,541,786 B1 * | 4/2003 | Partlo et al. | 250/504 R |
| 6,566,667 B1 * | 5/2003 | Partlo et al. | 250/504 R |
| 6,586,757 B2 * | 7/2003 | Melnychuk et al. | 250/504 R |
| 6,650,679 B1 * | 11/2003 | Bragin et al. | 372/87 |
| 6,771,683 B2 * | 8/2004 | Scaggs | 372/57 |
| 6,804,327 B2 * | 10/2004 | Schriever et al. | 378/119 |

* cited by examiner

*Primary Examiner*—John R. Lee
*Assistant Examiner*—David A. Vanore
(74) *Attorney, Agent, or Firm*—Reed Smith LLP

(57) ABSTRACT

The invention is directed to a method and an arrangement for generating extreme ultraviolet (EUV) radiation, i.e., radiation of high-energy photons in the wavelength range from 11 to 14 nm, based on a gas discharge. The object of the invention, to find a novel possibility for generating EUV radiation in which an extended life of the system is achieved with stable generation of a dense, hot plasma column, is met according to the invention in that a preionization discharge is ignited between two parallel disk-shaped flat electrodes prior to the main discharge by a surface discharge along the superficies surface of a cylindrical insulator with a plasma column generated through the gas discharge with pulsed direct voltage, which preionization discharge carries out an ionization of the working gas in the discharge chamber by means of fast charged particles. The preionization discharge is triggered within a first electrode housing and the main discharge takes place between a narrowed output of the first electrode housing and a part of the second electrode housing close to the outlet opening of the discharge chamber. The plasma develops in a part of the second electrode housing covered by a tubular insulator and, as a result of the current-induced magnetic field, contracts to form a dense, hot plasma column, one end of which is located in the vicinity of the outlet opening of the second electrode housing.

36 Claims, 5 Drawing Sheets

ARRANGEMENT FOR GENERATING EXTREME ULTRAVIOLET (EUV) RADIATION BASED ON A GAS DISCHARGE

CROSS-REFERENCE TO RELATED APPLICATIONS

This application claims priority of German Application No. 101 51 080.2, filed Oct. 10, 2001, the complete disclosure of which is hereby incorporated by reference.

BACKGROUND OF THE INVENTION a) Field of the Invention

The invention is directed to an arrangement for generating extreme ultraviolet (EUV) radiation based on a gas discharge, i.e., radiation of high-energy photons in the wavelength range from 11 to 14 nm (EUV=extreme ultraviolet range).

b) Description of the Related Art

As structures of integrated circuits on chips become increasingly smaller in the future, radiation of increasingly shorter wavelength will be needed in the semiconductor industry to expose these structures. Lithography machines with excimer lasers which attain their shortest wavelength at 157 nm and in which transmission optics or catadioptic systems are employed are currently in use.

Therefore, radiation sources which further increase resolution with even shorter wavelengths for imaging will have to be available in the future (around the year 2007). However, the optical systems must comprise reflection optics at wavelengths below 157 nm because there are no available materials which are transparent for these wavelengths. When using reflection optics, the numerical aperture is limited and the diversity of optical elements is restricted. The lower numerical aperture of the optics results in decreased resolution of the system which can only be compensated by an even shorter wavelength (by about an order of magnitude).

In principle, both laser-induced plasmas and gas discharge plasmas are suited for generating EUV radiation. Laser-induced plasma requires an energy conversion in two stages: from electrical energy to laser radiation energy and from laser energy to EUV radiation energy. This twofold conversion results in reduced conversion efficiency compared to gas discharge.

With respect to gas discharges, different concepts are pursued in plasma focus devices, capillary discharge devices, hollow cathode discharge devices and Z-pinch devices.

Compared to the other concepts, the plasma focus method has the disadvantage of poor spatial stability because of the formation of plasma. In this connection, U.S. Pat. No. 5,763,930 suggests a variant using a noble gas with lithium as working gas. However, this leads to additional contamination of the surroundings, particularly the insulator.

Another competing concept, capillary discharge, has only a short life and, consequently, limited applicability.

The Z-pinch concept exhibits good characteristics compared to other gas discharge concepts and laser-induced plasmas. In a published technical solution according to U.S. Pat. No. 5,504,795, preionization by means of R-F (radiofrequency) discharge is realized in an insulator tube in which the plasma is likewise ignited subsequently. This high-frequency preionization system is directly coupled to the discharge system and is therefore exposed to plasma radiation and to bombardment by charged particles resulting in a shorter life of the insulator tube in particular.

OBJECT AND SUMMARY OF THE INVENTION

It is the primary object of the invention to find a novel possibility for generating EUV radiation in which an extended life of the system is achieved with stable generation of a dense, hot plasma column.

According to the invention, in an arrangement for generating extreme ultraviolet (EUV) radiation based on a gas discharge with a discharge chamber which is enclosed by a first electrode housing and a second electrode housing and through which a working gas flows under a determined pressure, the two electrode housings being arranged coaxial to one another and having cylindrical superficies surfaces which face the discharge chamber and which are isolated from one another by an insulator layer so as to resist puncture or breakthrough, and an outlet opening for the EUV radiation which is provided axially in the second electrode housing, the above-stated object is met in that a coaxially arranged preionization unit having parallel, substantially flat electrodes at a distance from one another axially is provided in the interior of the first electrode housing, wherein the flat electrodes are substantially circular and a cylindrical insulator in which at least one electric line is inserted is arranged between the flat electrodes, so that a sliding discharge is generated along the superficies surface of the cylindrical insulator when a sufficiently high voltage is applied to the flat electrodes, in that the first electrode housing has a narrowed output in the direction of the second electrode housing, and in that the cylindrical superficies surface of the second electrode housing is covered by a tubular insulator at least in the immediate vicinity of the narrowed output of the first electrode housing.

An end face of the first electrode housing is advantageously provided as one of the flat electrodes of the preionization unit. The preionization unit with the cylindrical insulator is inserted into the rear end face of the first electrode housing and the line for the other flat electrode is guided into the interior of the cylindrical insulator.

The flat electrodes of the preionization unit are connected to a preionization pulse generator which advisably generates high-voltage pulses with short rise times.

The line for the other flat electrode of the preionization unit is preferably constructed as a metal tube which is provided at the same time as a flow tube for the working gas. The tube can be used at the same time as a leadthrough for arranging a radiation detector for measuring the EUV radiation which is radiated back by the plasma column.

The tube of the preionization unit can advantageously communicate with a regulated gas supply system as a gas inlet for the working gas. A vacuum system connected to the outlet opening for the EUV radiation is provided as gas outlet.

In another construction variant, the tube of the preionization unit is connected to a vacuum system as a gas outlet for the working gas, wherein gas inlets communicating with a regulated gas supply system are provided in the second electrode housing for supplying gas. The gas inlets are advisably arranged so as to be evenly distributed in a plane about the axis of symmetry of the discharge chamber. The gas inlets can be inserted in an end face of the second electrode housing comprising the outlet opening or in the cylindrical superficies surface of the second electrode housing. In both cases, the gas inlets are introduced radially in the discharge chamber so that the working gas flows into the second electrode housing as uniformly as possible.

The working gas is preferably a noble gas such as xenon, krypton, argon or neon. However, oxygen, nitrogen or lithium vapor can also be used. Also, to enhance conversion, gas mixtures of xenon or helium with added hydrogen or deuterium can advantageously be used, or, when using lithium vapor, helium or neon can advantageously be used as added gas.

The cylindrical insulator of the preionization unit is preferably produced from a material with a high dielectric constant, preferably lead zirconium titanate (PZT), lead borsilicate or lead zinc borsilicate. It is advisably manufactured in such a way that it has channels through which a coolant can flow.

In order to achieve a reliable insulation of the output of the first electrode housing relative to the superficies surface of the second electrode housing, the tubular insulator in the second electrode housing is advantageously extended into the first electrode housing, the narrowed output of the first electrode housing projecting into the interior of the tubular insulator. The tubular insulator advisably comprises a highly insulating ceramic, particularly $Si_3N_4$, $Al_2O_3$, AlZr, AlTi, BeO, SiC or sapphire.

The tubular insulator preferably completely covers the cylindrical superficies surface of the second electrode housing.

In order to generate the gas discharge (main discharge), the first electrode housing is advisably connected to a high-voltage pulse generator as cathode and the second electrode housing is preferably connected to a high-voltage pulse generator as anode. In another advantageous construction, the first electrode housing is connected as anode and the second electrode housing is connected as cathode.

The pulse generator is advisably operated by a thyratron circuit which contains a single-stage or multistage compression module with magnetically saturable cores. Alternatively, it can also be constructed exclusively from semiconductor components.

The pulse generator is advantageously adjustable to a repetition frequency in the range of 1 Hz to 20 kHz and to a voltage which is sufficient for igniting the gas discharge and generating a plasma column with high density and high temperature.

Because of the high current load and thermal stress, the electrode housings are advisably made from materials with high proportions of tungsten, tantalum or molybdenum, at least in the area of the outputs. Tungsten-copper alloys, particularly 90% W and 10% Cu or 80% W and 20% Cu (B3C) are preferably used.

As another step for reducing wear, the electrode housings have cavities which communicate with a coolant reservoir via oppositely located connections. Additional cooling fins can be provided in the cavities for increasing the inner surface for heat transfer.

In a method for generating extreme ultraviolet (EUV) radiation based on a gas discharge in which a main discharge is triggered by direct voltage pulses in a substantially cylindrical discharge chamber which is enclosed by a first electrode housing and a coaxial second electrode housing and through which a working gas flows under a defined pressure, wherein the main discharge is supported by means of preionization, and a plasma column resulting from the main discharge along the axis of symmetry of the discharge chamber emits the EUV radiation through an outlet opening of the discharge chamber, the above-stated object according to the invention is met in general in that prior to the main discharge a preionization discharge is ignited between two parallel disk-shaped flat electrodes by means of a surface discharge along the superficies surface of a cylindrical insulator, which preionization discharge, in addition to a radiation emission in the wavelength range of ultraviolet to x-ray radiation, generates fast charged particles which cause an ionization of the working gas in the discharge chamber, in that the preionization discharge is triggered within a first electrode housing, and in that the main discharge takes place between a narrowed output of the first electrode housing and a portion of a second electrode housing near the outlet opening of the discharge chamber, wherein the plasma causes a progressing ionization of the working gas in one of the two electrode housings.

By means of the arrangement according to the invention and the method implemented by means of this arrangement, it is possible to generate an EUV radiation in the range of 11 to 14 nm with reproducible generation of a dense, hot plasma column and an extended system life.

The invention will be described more fully in the following with reference to embodiment examples.

DESCRIPTION OF THE PREFERRED EMBODIMENTS

Figure 1:
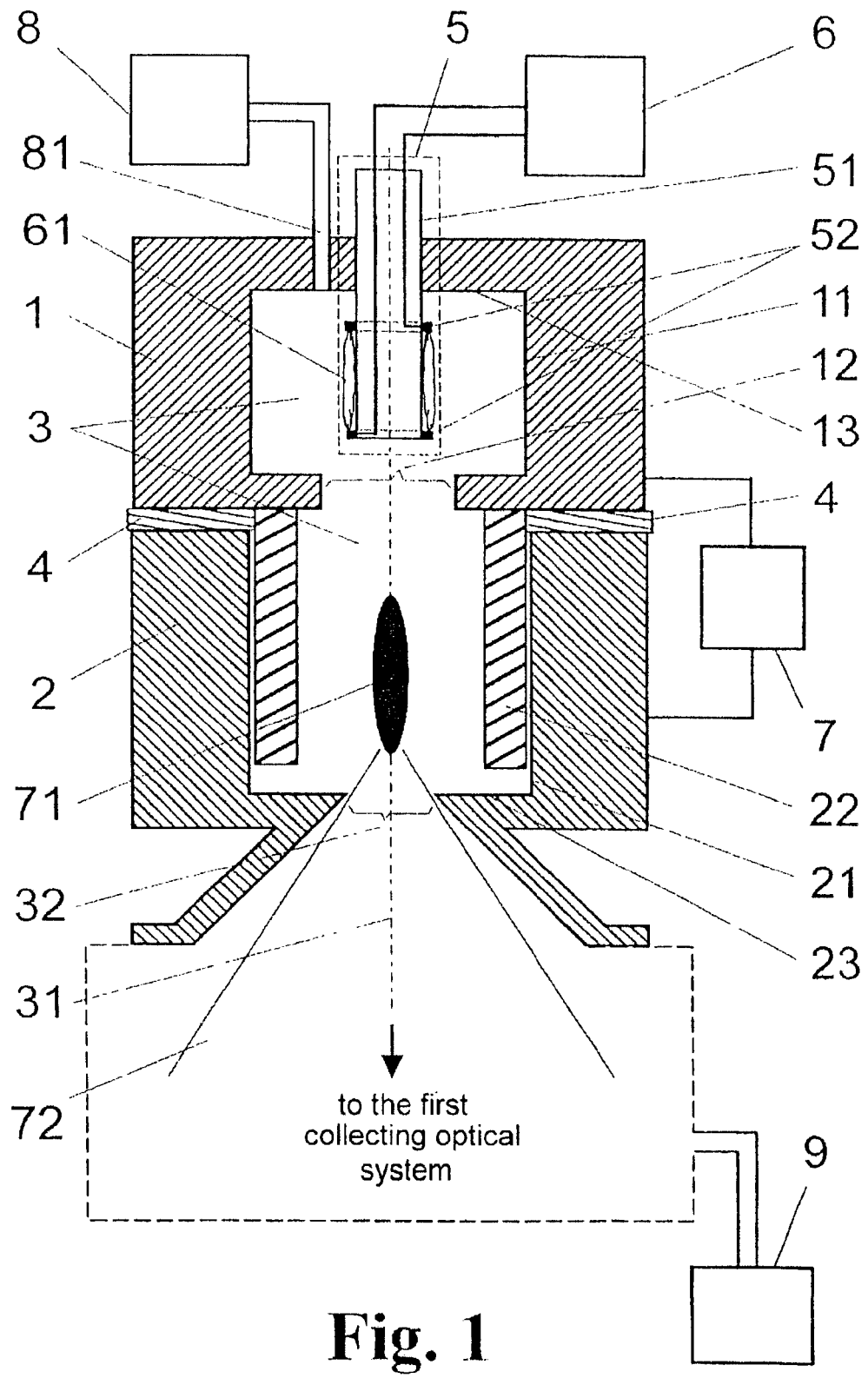
FIG. 1 shows a schematic view of the arrangement according to the invention.

As is shown in FIG. 1, the basic arrangement according to the invention comprises a first electrode housing 1 and a second electrode housing 2 which together form a discharge chamber 3, the two electrode housings 1 and 2 being insulated relative to one another against breakthrough by an insulating layer 4 and a tubular insulator 22 in the interior of the second electrode housing 2, a preionization unit 5 which is arranged coaxially inside the first electrode housing 1 and communicates with the preionization pulse generator 6, a high-voltage pulse generator 7 to which the two electrode housings 1 and 2 are connected, a gas supply system 8 for feeding working gas into the discharge chamber 3 so as to be regulated in a defined manner, and a vacuum system 9.

The two electrode housings 1 and 2 are arranged coaxially one over the other and have inner cylinder superficies surfaces 11 and 21 which define the discharge chamber 3 radially around the axis of symmetry 31. The first electrode housing 1 has a narrowed output 12 in the direction of the second electrode housing 2 and has a plane rear end face 13 at which the preionization unit 5 projects coaxially into the interior.

At its cylindrical superficies surface 21, the second electrode housing 2 is covered toward the discharge chamber 3 by the tubular insulator 22 which, together with the insulation layer 4 which is arranged along the surface in lateral direction to the axis of symmetry 31 of the discharge chamber 3, electrically isolates the electrode housings 1 and 2 from one another. This prevents an electric discharge between the first electrode housing 1 and the adjoining parts (including essential parts of the cylindrical superficies surface 21) of the second electrode housing 2, and the discharge takes place in a defined manner in the interior of the tubular insulator 22 between the narrowed output 12 of the first discharge chamber 1 and the end (not insulated) of the second electrode housing 2.

Because of its narrowed output 12, the first electrode housing 1 has a relatively small opening toward the second electrode housing 2. In this way, a separate room in which preionization takes place is formed in the first electrode housing 1. The preionization unit 5 contains a cylindrical insulator of highly insulating ceramic (hereinafter referred to as ceramic cylinder 51) which is guided coaxially into the interior of the first electrode housing 1 through the rear end face 13, and coaxial disk-shaped flat electrodes 52 which are arranged concentrically outside the ceramic cylinder 51 on the one hand and on its end face in the interior of the first electrode housing 1 on the other hand. The electric connection of the flat electrodes 52 to a preionization pulse generator 6 is carried out inside the ceramic cylinder 51.

A working gas which is admitted by a regulated gas supply system 8 under defined pressure flows through the discharge chamber 3, wherein a vacuum (in the range of 1 to 20 Pa) is realized in the entire discharge chamber 3 by means of an oppositely connected vacuum system 9.

When the preionization pulse generator 6 sends a sufficient voltage pulse to the flat electrodes 52, a sliding discharge 61 forms along the surface of the ceramic cylinder 51. In addition to radiation in the range of ultraviolet to x-ray, this sliding discharge 61 generates fast charged particles resulting in a progressing ionization of the working gas in the entire discharge chamber. The main discharge is then ignited by means of the high-voltage pulse generator 7 via the first and second electrode housings 1 and 2 and leads to the formation of gas discharges and cylindrical plasma between the narrowed output 12 of the first electrode housing 1 and the front side 23 of the second electrode housing 2. The considerable flow of current generates a tangential magnetic field of a magnitude such that the plasma contracts on the axis of symmetry 31 of the discharge chamber 3 so that there is formed in the second electrode housing 2 a dense, hot plasma column 71 whose emitted EUV emission 72 exits through the outlet opening 32 of the discharge chamber 3 located in the end face 23 of the second electrode housing 2 and is focused by a first collecting optical system (not shown).

Figure 2:
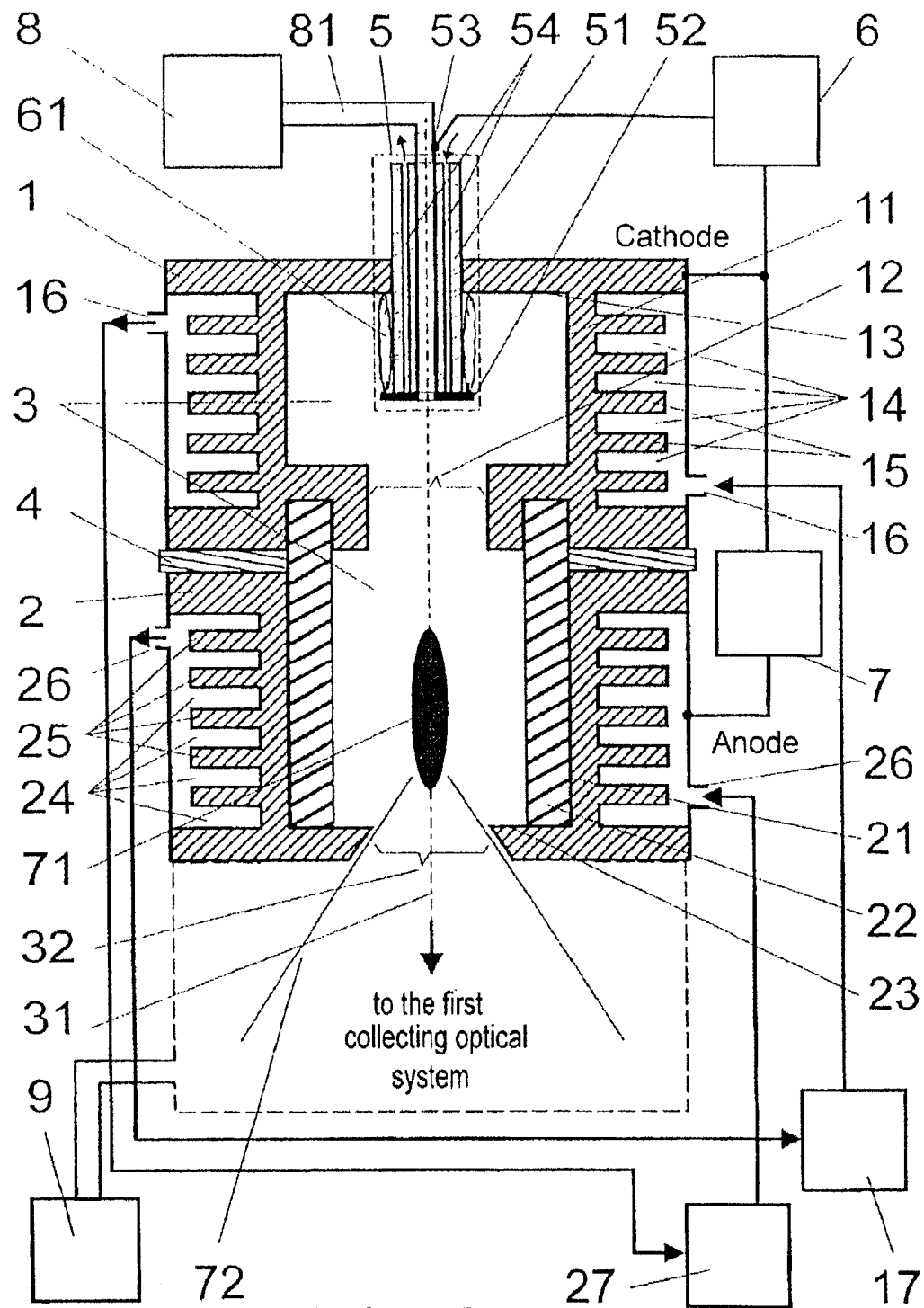
FIG. 2 shows a construction variant of the invention with an EUV radiation outlet from the anode.

In FIG. 2, the preionization unit 5 is simplified in that one of the flat electrodes 52 is combined with the end face 13 of the first electrode housing 1. The construction of the preionization unit 5 is accordingly simplified in that only one (central) line is required for the flat electrode 52 remaining at the end of the ceramic cylinder 51. In this case, the latter can be a metallic tube 53 which is provided at the same time as a gas inlet 81 for the flow of working gas through the discharge chamber 3. The metallic tube 53 is accordingly connected to the preionization pulse generator 6 which communicates with the first electrode housing 1. In this example, the first electrode housing 1 functions as the cathode and the second electrode housing 2 is the anode. The electrode housings 1 and 2 are connected to the high-voltage pulse generator 7 which can supply electric pulses with repetition frequencies between 1 Hz and 20 kHz. For photolithographic purposes in the semiconductor industry, repetition frequencies between 4 and 8 kHz must be set in order to achieve sufficient exposure per surface and time and low intensity variations.

In the example according to FIG. 2, the working gas is introduced through the metallic tube 53 of the preionization unit 5. The pressure of the working gas is held constant via the gas supply system 8 which leads to an optimal gas flow in the discharge chamber 3. A preionization pulse is applied between the first electrode housing 1 (which is also the cathode for the main discharge) and the flat electrode 52. For this purpose, the disk-shaped flat electrode 52 is electrically connected with the preionization pulse generator 6 via the tube 53. The preionization pulse generator 6 generates electric pulses with a typical rise time of $10^{11}$ V/s and voltages which are sufficient for generating a surface discharge (sliding discharge 61) at the outer surface of the ceramic cylinder 51. In addition to radiation from the ultraviolet to the x-ray range, this sliding discharge 61 (at the given electrode polarity) generates, above all, fast electrons which produce sufficient ionization of the working gas of the entire discharge chamber 3. The main discharge pulse then ignites a gas discharge between the output 12 of the first electrode housing 1 and the end face 23 of the second electrode housing 2. The plasma forms virtually in the entire interior space of the tubular insulator 22. The peak current of the high-voltage pulse generator 7 is about 54 kA with a pulse duration of 330 ns. The plasma which is initially shaped as a cylinder "implodes" due to the magnetic forces induced by the electrical current through the gas discharge to the axis of symmetry 31 of the discharge chamber 3 formed by the electrode housings 1 and 2 and forms a plasma column 71 of high density (with a length from 1 mm to 50 mm and a diameter from 0.2 to 4 mm) directly in front of the outlet opening 22 of the second electrode housing 2 (anode). The high-voltage pulse generator 7 contains a thyratron circuit with a single or multiple compression stage based on magnetically saturable cores (as disclosed, e.g., in U.S. Pat. No. 6,226,307 B1). However, a high-voltage pulse generator 7 containing semiconductor components can also be used.

Figure 4:
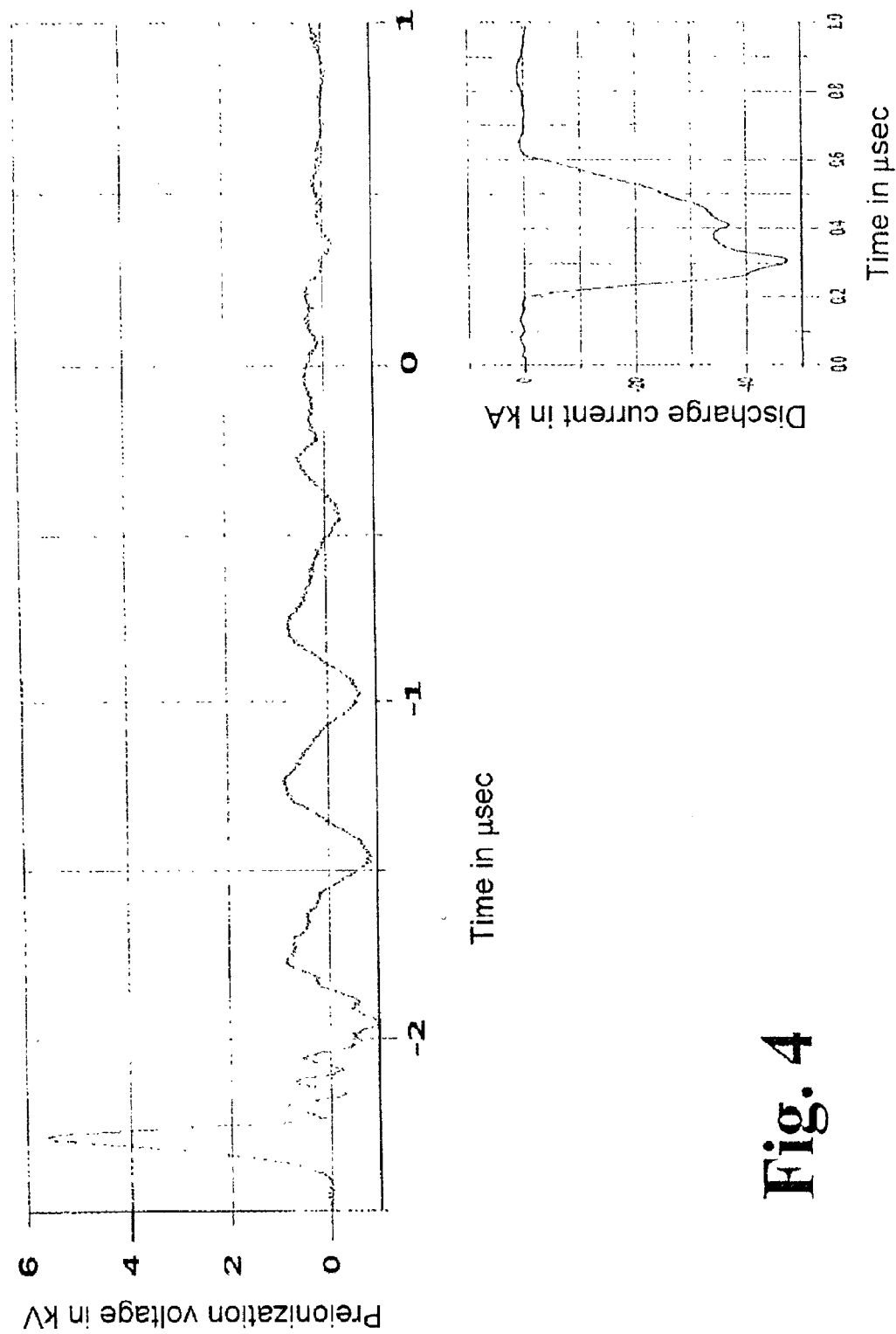
FIG. 4 shows a voltage-time diagram of the preionization pulse generator and a current-time diagram of the high-voltage pulse generator.
Figure 5:
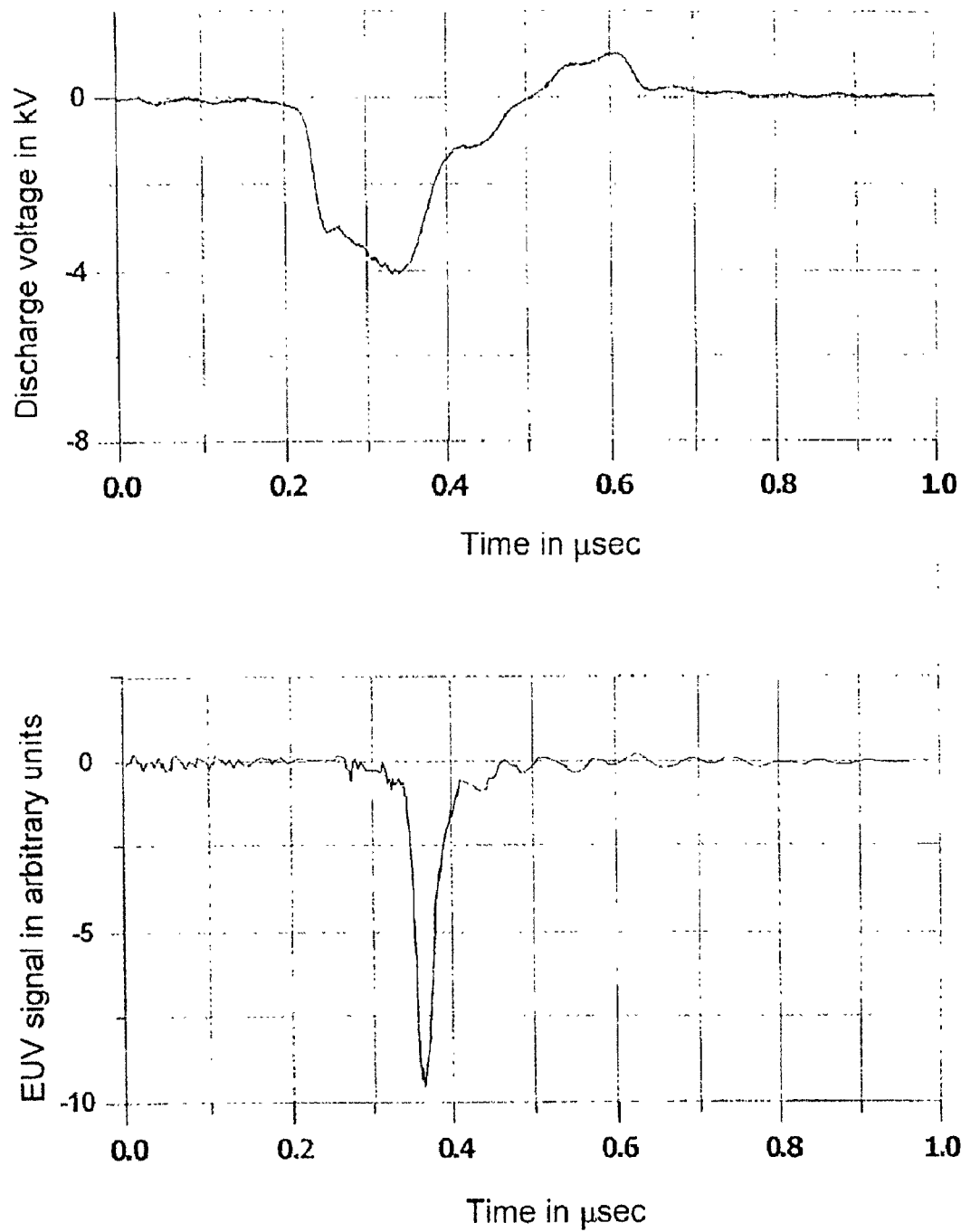
FIG. 5 shows diagrams of the discharge voltage and EUV radiation.
Figure 2:
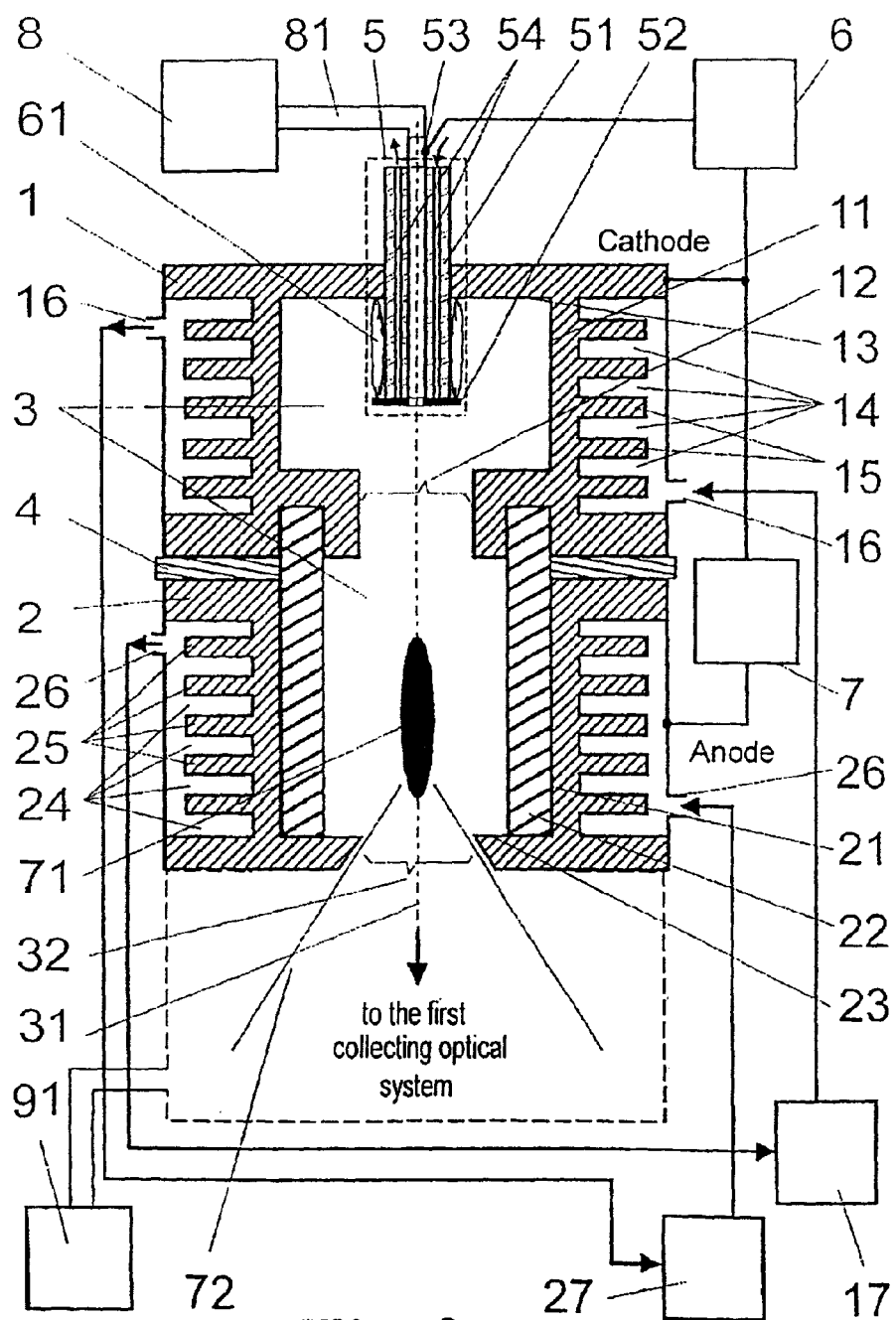
Figure 2:
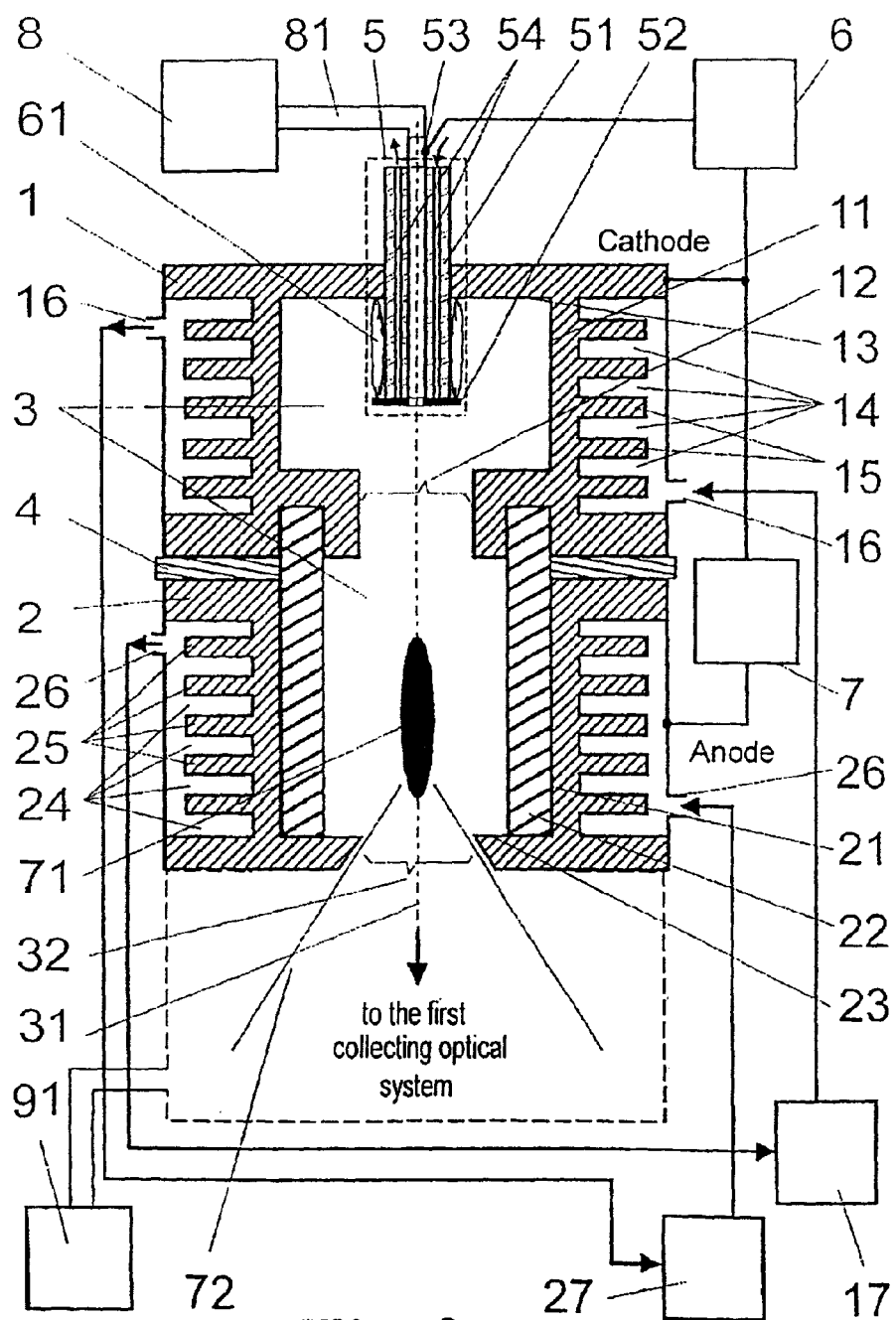
Figure 3:
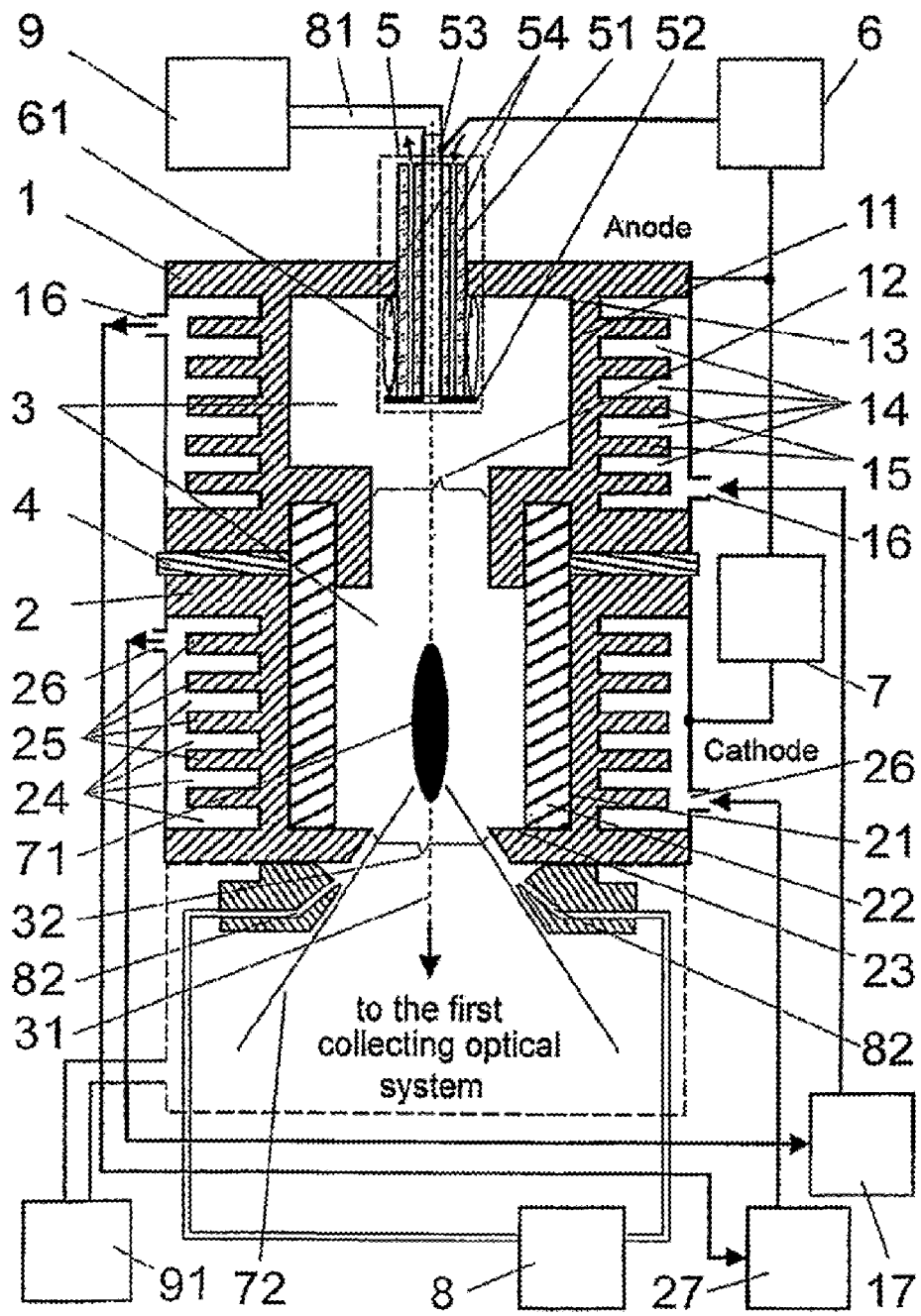

The main discharge takes place a few microseconds ($\mu$s) later than the surface discharge of the preionization unit 5. To illustrate this, the signals of the preionization voltage, the discharge current, the discharge voltage and a photodiode signal of the EUV emission 72 are shown in FIGS. 4 and 5.

The selected type of preionization guarantees the homogeneous triggering of the discharge by the main discharge pulse. The decisive advantage of this preionization is that the preionization unit 5 is not directly exposed to the radiation from the plasma and a long useful life is accordingly achieved.

The tubular insulator 22 at the inner cylindrical superficies surface 21 of the second electrode housing 2 is made from $Si_3N_4$ and has proven to be a very durable material with a life of $2 \times 10^6$ pulses in continuous operation without destruction. Instead of $Si_3N_4$, various other insulating materials such as $Al_2O_3$, AlN, AlZr, AlTi, SiC or sapphire can also be used.

The electrode housings 1 and 2 are produced in such a way that a continuous flow of coolant can flow around the discharge chamber 3 in each cooling channel 14 and 24. In order to increase the transfer of heat, cooling fins 15 and 25 are incorporated in the cooling channels 14 and 24 of the first and second electrode housings 1 and 2. The coolant can accordingly absorb heat on an enlarged surface and cooling power is improved. The coolant is provided by coolant reservoirs 17 and 27 and supplied to and removed from the electrode housings 1 and 2 via oppositely located connections 16 and 26. This design is necessary because an EUV source for industrial applications must be operated continuously for several weeks. If not cooled, the electrodes would reach extremely high temperatures due to the current and radiation. Cooling is also provided in the preionization unit 5 via channels 54. In both cases, liquids with low viscosity such as oil (e.g., Galden) or distilled or deionized water are used as coolants.

Figure 3:
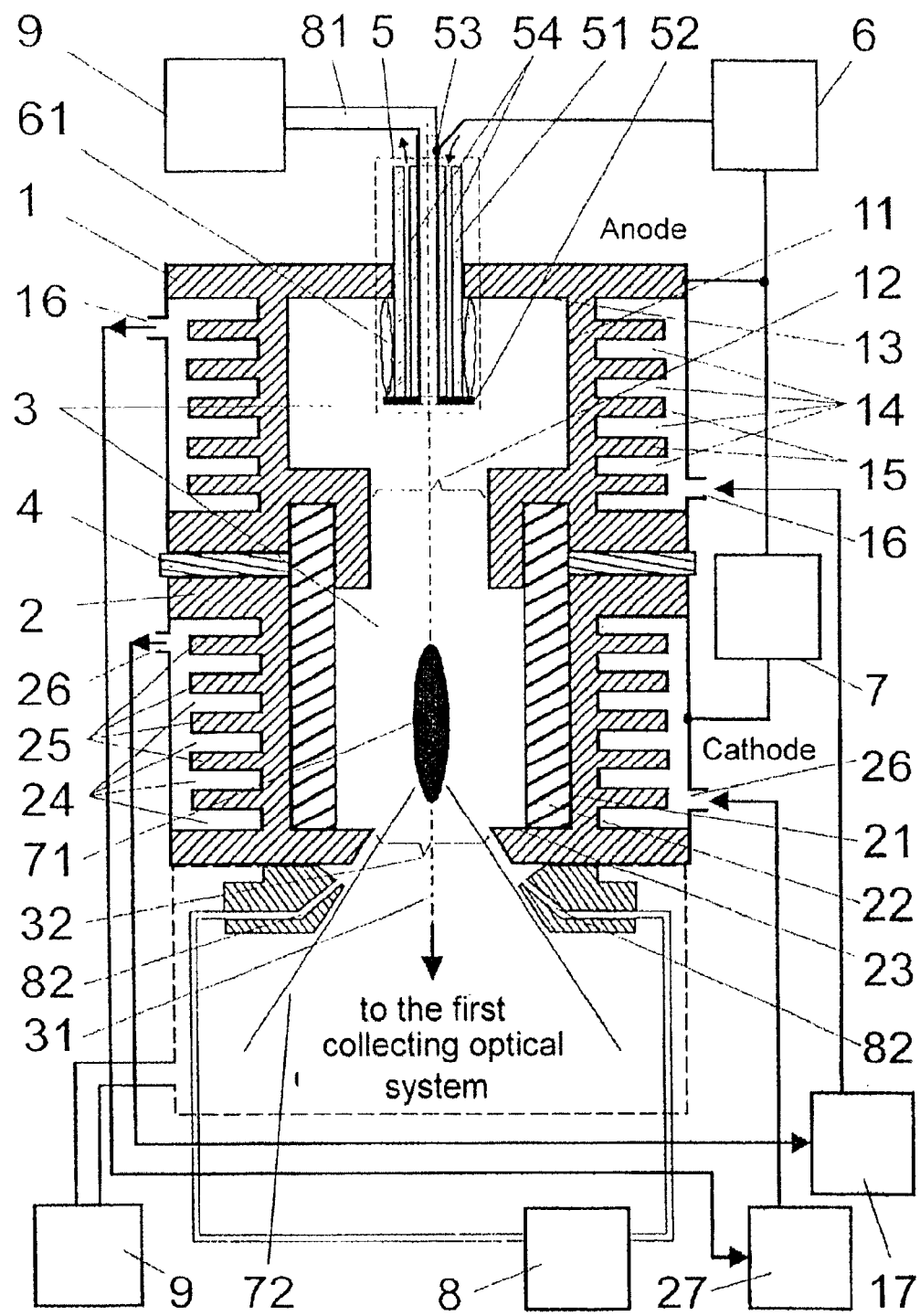
FIG. 3 shows another construction variant of the invention similar to FIG. 2, but with radiation outlet from the cathode and opposite flow direction of the working gas.

The arrangement according to the invention can also be operated with reversed polarity of the high voltage. In this connection, FIG. 3 shows a corresponding view in which the electrode polarity of the first and second electrode housing 1 or 2 is changed. Compared to the preionization unit 5 described in the preceding example, with the polarity of the preionization voltage likewise being reversed, only the generation of fast charged particles is changed in such a way that instead of electrons only ions are released in the sliding discharge 61. However, they cause a preionization of the working gas in the discharge chamber 3 in the same way. Aside from the changed direction of the discharge current between the first and second electrode housings 1 and 2, however, the generation of the plasma, the formation of the plasma column 71 and the emission of the EUV radiation 72 are achieved in the same manner as described in FIG. 2.

It is also important to note the modified gas feed in the embodiment form according to FIG. 3 which has gas inlets 82 in the second electrode housing 2 in this example. This design has the advantage of uniform flow through the second electrode housing 2 in particular and the main discharge is ignited homogeneously. For this purpose, the gas inlets 82 at the second electrode housing are arranged so as to be uniformly distributed (or are arranged symmetrically in pairs) and ensure a uniform flow of gas into the discharge chamber 3. On the other side of the discharge chamber 3 in the first electrode housing 1, the tube 53 for the through-flow of working gas is provided in a manner analogous to the construction of the preionization unit 5 according to FIG. 2 and, in this case, is connected to the vacuum system 9. However, the vacuum required in the discharge chamber 3 for the discharge processes should be supported—as indicated in FIG. 2—by another connection of a main vacuum system 91 after the outlet opening 32 of the discharge chamber 3.

Other design variants of the invention are possible without departing from the framework of the present invention. In the preceding examples, an aspect ratio of the electrode housings 1 and 2 (diameter to length) of approximately 1:1 was assumed, but substantially different ratios are also permissible as long as the described discharge processes (preionization and main discharge) take place in the manner described above. The geometric shapes of the electrode housings 1 and 2 can also be substantially modified with respect to their axial separation into two chambers, wherein the characteristics of the EUV source are changed, but without departing from the principle of the generation of a reproducible stable plasma with spatially isolated preionization.

While the foregoing description and drawings represent the present invention, it will be obvious to those skilled in the art that various changes may be made therein without departing from the true spirit and scope of the present invention.

Reference Numbers
1 first electrode housing
11 cylindrical superficies surface
12 narrowed output
13 end face
14 cooling channels
15 fins
16 connections
17 coolant reservoir
2 second electrode housing
21 cylindrical superficies surface
22 tubular insulator
23 end face
24 cooling channels
25 cooling fins
26 connections
27 coolant reservoir
3 discharge chamber
31 axis of symmetry
32 outlet opening
4 insulator layer
5 preionization unit
51 ceramic cylinder (cylindrical insulator)
52 flat electrodes
53 tube
54 channels
6 preionization pulse generator
61 sliding discharge
7 high-voltage pulse generator
71 plasma column
72 EUV radiation
8 regulated gas feed system
81 gas inlet (in the first electrode housing)
82 gas inlets (in the second electrode housing)
9 vacuum system
91 main vacuum system

What is claimed is:

1. An arrangement for generating extreme ultraviolet (EUV) radiation based on a gas discharge comprising:

a discharge chamber which is enclosed by a first electrode housing and a second electrode housing and through which a working gas flows under a defined pressure;

said two electrode housings being arranged coaxial to one another and having cylindrical superficies surfaces which face the discharge chamber and which are isolated from one another by an insulator layer so as to resist breakthrough;

an outlet opening for the EUV radiation which is provided axially in the second electrode housing;

a coaxially arranged preionization unit having two parallel, substantially flat electrodes at a distance from one another axially being provided in the interior of the first electrode housing;

said flat electrodes being substantially circular;

a cylindrical insulator in which at least one electric line is inserted being arranged between said flat electrodes, so that a sliding surface discharge is generated along the superficies surface of the cylindrical insulator when a sufficiently high voltage is applied to the flat electrodes;

said first electrode housing having a narrowed output in the direction of the second electrode housing; and said cylindrical superficies surface of the second electrode housing being covered by a tubular insulator at least in the immediate vicinity of a narrowed output of the first electrode housing.

2. The arrangement according to claim 1, wherein an end face of the first electrode housing is provided as one of the flat electrodes of the preionization unit, wherein the preionization unit with the cylindrical insulator is inserted into the end face of the first electrode housing and the line for the other flat electrode is guided into the interior of the cylindrical insulator.

3. The arrangement according to claim 1, wherein the flat electrodes of the preionization unit are connected to a preionization pulse generator which generates high-voltage pulses with short rise times.

4. The arrangement according to claim 2, wherein the line for the other flat electrode of the preionization unit is a metal tube which is provided at the same time as a flow tube for the working gas.

5. The arrangement according to claim 4, wherein the tube is provided at the same time as a leadthrough for arranging a radiation detector for measuring the EUV radiation which is radiated back by the plasma column.

6. The arrangement according to claim 4, wherein the tube of the preionization unit communicates with a regulated gas supply system as a gas inlet for the working gas.

7. The arrangement according to claim 4, wherein the tube of the preionization unit is connected to a vacuum system as a gas outlet for the working gas, wherein gas inlets communicating with a regulated gas supply system are provided in the second electrode housing for supplying gas.

8. The arrangement according to claim 7, wherein the gas inlets are arranged so as to be evenly distributed in a plane about the axis of symmetry of the discharge chamber.

9. The arrangement according to claim 8, wherein the gas inlets are arranged so as to be evenly distributed in the cylindrical superficies surface of the second electrode housing.

10. The arrangement according to claim 8, wherein the gas inlets are arranged so as to be evenly distributed at an end face of the second electrode housing comprising the outlet opening.

11. The arrangement according to claim 9, wherein the gas inlets are introduced radially into the second electrode housing.

12. The arrangement according to claim 4, wherein a noble gas is used as working gas.

13. The arrangement according to claim 12, wherein the working gas is xenon.

14. The arrangement according to claim 4, wherein oxygen or nitrogen is used as working gas.

15. The arrangement according to claim 4, wherein lithium vapor is used as working gas.

16. The arrangement according to claim 12, wherein a mixture is used as working gas and wherein the added gas is hydrogen or deuterium.

17. The arrangement according to claim 13, wherein a mixture is used as working gas and wherein the added gas is helium or neon.

18. The arrangement according to claim 1, wherein the cylindrical insulator of the preionization unit is produced from a material with a high dielectric constant.

19. The arrangement according to claim 18, wherein the insulator is selected from a group consisting of lead zirconium titanate (PZT), lead borsilicate or lead zinc borsilicate.

20. The arrangement according to claim 1, wherein the cylindrical insulator of the preionization unit has channels for the coolant to flow through.

21. The arrangement according to claim 1, wherein the tubular insulator completely covers the inner cylindrical superficies surface of the second electrode housing.

22. The arrangement according to claim 1, wherein the tubular insulator extends into the first electrode housing and the narrowed output of the first electrode housing projecting into the interior of the tubular insulator.

23. The arrangement according to claim 1, wherein the tubular insulator comprises a highly insulating ceramic selected from the group consisting of $Si_3N_4$, $Al_2O_3$, AlZr, AlTi, BeO, SiC or sapphire.

24. The arrangement according to claim 1, wherein the first electrode housing is connected to a high-voltage pulse generator as cathode and the second electrode housing is connected to a high-voltage pulse generator as anode.

25. The arrangement according to claim 1, wherein the first electrode housing is connected to a high-voltage pulse generator as anode and the second electrode housing is connected to a high-voltage pulse generator as cathode.

26. The arrangement according to claim 1, wherein the high-voltage pulse generator contains a thyratron circuit connected to a single-stage or multistage compression module with magnetically saturable cores.

27. The arrangement according to claim 1, wherein the high-voltage pulse generator contains semiconductor components.

28. The arrangement according to claim 26, wherein the high-voltage pulse generator is adjustable to repetition frequencies in the range of 1 Hz to 20 kHz and voltages which are sufficient for igniting the gas discharge and for compressing the plasma to a column with high density and high temperature.

29. The arrangement according to claim 1, wherein the electrode housings are made from materials with high proportions of tungsten, tantalum or molybdenum, at least in the area of their surfaces headed to the plasma.

30. The arrangement according to claim 29, wherein the electrode housings comprise in the area of their surfaces headed to the plasma alloys of tungsten-copper, in particular, 90% W and 10% Cu, or 80% W and 20% Cu (B3C).

31. The arrangement according to claim 1, wherein the electrode housings have cavities in the housing wall which communicate with a coolant reservoir via oppositely located connections.

32. The arrangement according to claim 31, wherein cooling fins are provided in the cavities for increasing the inner surface for heat transfer.

33. A method for generating extreme ultraviolet (EUV) radiation based on a gas discharge in which a main discharge is initiated by direct voltage pulses in a substantially cylindrical discharge chamber which is enclosed by a first electrode housing and a coaxial second electrode housing and through which a working gas flows under a defined pressure, wherein the main discharge is supported by preionizations and a plasma column resulting from the main discharge along the axis of symmetry of the discharge chamber emits the EUV radiation through an outlet opening of the discharge chamber, comprising the steps of:

igniting, prior to the main discharge, a preionization discharge between two parallel circular flat electrodes by a surface discharge along the superficies surface of a cylindrical insulator, which preionization discharge, in addition to a radiation emission in the wavelength range from ultraviolet to x-ray radiation, generates fast charged particles which cause an ionization of the working gas in the discharge chamber;

wherein the preionization discharge is ignited within the first electrode housing; and allowing the main discharge to take place between a narrowed output of the first electrode housing and a portion of a second electrode housing near the outlet opening of the discharge chamber, wherein the plasma develops in a tubular insulator which shields essential parts of the second electrode housing relative to the first electrode housing and, as a result of the current-induced magnetic field, the plasma contracts to form a dense, hot plasma column, one end of which is located in the vicinity of the outlet opening of the discharge chamber.

34. A method according to claim 33, wherein the preionization discharge and the main discharge are triggered successively in time in a synchronized manner with a repetition frequency between 1 Hz and 20 kHz.

35. An arrangement according to claim 33, wherein the preionization discharge is triggered between a flat electrode and the first electrode housing connected as cathode, and the main discharge takes place between the narrowed output of the first electrode housing and an open portion of the second electrode housing which is covered by the tubular insulator and connected as anode.

36. A method according to claim 33, wherein the preionization discharge is triggered between a flat electrode and the first electrode housing connected as anode, and the main discharge takes place between the narrowed output of the first electrode housing and an open portion of the second electrode housing which is covered by the tubular insulator and connected as cathode.

* * * * *

UNITED STATES PATENT AND TRADEMARK OFFICE
CERTIFICATE OF CORRECTION

PATENT NO. : 6,894,298 B2
APPLICATION NO. : 10/267373
DATED : May 17, 2005
INVENTOR(S) : Imtiaz Ahmad et al.

It is certified that error appears in the above-identified patent and that said Letters Patent is hereby corrected as shown below:

TITLE PAGE should read;
-- [73] Assignee:     XTREME technologies GmbH, Jena (DE) --.

should read;
-- [30] Foreign Application Priority Data
       October 10, 2001  (DE)      101 51 080.2 --.

DRAWINGS:

Substitute sheets 2 of 5,      Figure 2     and;
               2 of 5,                 Figure 3 of the Letters patent.

Signed and Sealed this

Twenty-sixth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 6,894,298 B2
APPLICATION NO. : 10/267373
DATED : May 17, 2005
INVENTOR(S) : Imtiaz Ahmad et al.

It is certified that error appears in the above-identified patent and that said Letters Patent is hereby corrected as shown below:

TITLE PAGE should read;
-- [73]  Assignee:    XTREME technologies GmbH, Jena (DE) --.

should read;
-- [30]  Foreign Application Priority Data
         October 10, 2001  (DE)    101 51 080.2 --.

DRAWINGS:

Substitute sheets 2 of 5,    Figure 2    and;
                3 of 5,    Figure 3 of the Letters patent.

This certificate supersedes Certificate of Correction issued September 26, 2006.

Signed and Sealed this

Thirtieth Day of January, 2007

JON W. DUDAS
*Director of the United States Patent and Trademark Office*